United States Patent
Kawashima (10) Patent No.: US 6,707,703 B2
(45) Date of Patent: Mar. 16, 2004

(54) NEGATIVE VOLTAGE GENERATING CIRCUIT

(75) Inventor: Shoichiro Kawashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/335,921

(22) Filed: Jan. 3, 2003

(65) Prior Publication Data

US 2003/0128571 A1 Jul. 10, 2003

(30) Foreign Application Priority Data

Jan. 10, 2002 (JP) ........................... 2002-003025

(51) Int. Cl.$^7$ .............................................. G11C 11/22
(52) U.S. Cl. .................. 365/145; 365/189.09; 365/226
(58) Field of Search ................. 365/145, 149, 365/189.09, 226

(56) References Cited

U.S. PATENT DOCUMENTS 4,964,082 A * 10/1990 Sato et al. ............. 365/189.09
5,740,109 A * 4/1998 Morton et al. .............. 365/226
5,892,706 A * 4/1999 Shimizu et al. ............. 365/145

FOREIGN PATENT DOCUMENTS

JP 2002-133857 A 5/2002

OTHER PUBLICATIONS

"A Bit-Line GND Sense Technique for Low-Voltage Operation FeRAM," Shoichiro Kawashima et al., 2001 Symposium on VLSI Circuit, C12-3.

* cited by examiner

Primary Examiner—Huan Hoang
(74) Attorney, Agent, or Firm—Arent Fox Kintner Plotkin & Kahn (57) ABSTRACT

A first electrode of a capacitor C1 is connected to an output node N0, and through a PMOS transistor switch SW1 to ground. A second electrode of the capacitor C1 is on one hand connected through a node N1 to the output of a switching circuit 11, and on the other hand connected through a capacitor C2 and a node N2 to the output of a switching circuit 12. A control circuit 13 controls so that (1) in a first step, a switch SW1 is turned on to couple the output node N0 to ground, and the output of the switching circuits 11 and 12 are coupled to the power supply voltage VDD and ground, respectively; (2) in a second step, the output of the switching circuit 12 is coupled to the voltage supply voltage VDD with the output of the switching circuit 11 being in a high impedance state; and (3) in a third step, the output of the switching circuit 11 is coupled to ground with the switch SW1 being off and the output of the switching circuit 12 being in a high impedance state.

16 Claims, 8 Drawing Sheets

NEGATIVE VOLTAGE GENERATING CIRCUIT

CROSS-REFERENCE TO RELATED APPLICATIONS

This application is based upon and claims the benefit of priority from the prior Japanese Patent Application No. 2002-003025, filed on Jan. 10, 2002, the entire contents of which are incorporated herein by reference.

BACKGROUND OF THE INVENTION

1. Field of the Invention

The present invention relates to a negative voltage generating circuit, and particularly to the circuit that generates a deeper negative voltage than −VDD, where VDD is a power supply voltage, and is suitable for use in a ferroelectric memory circuit.

2. Description of the Related Art

Figure 7:
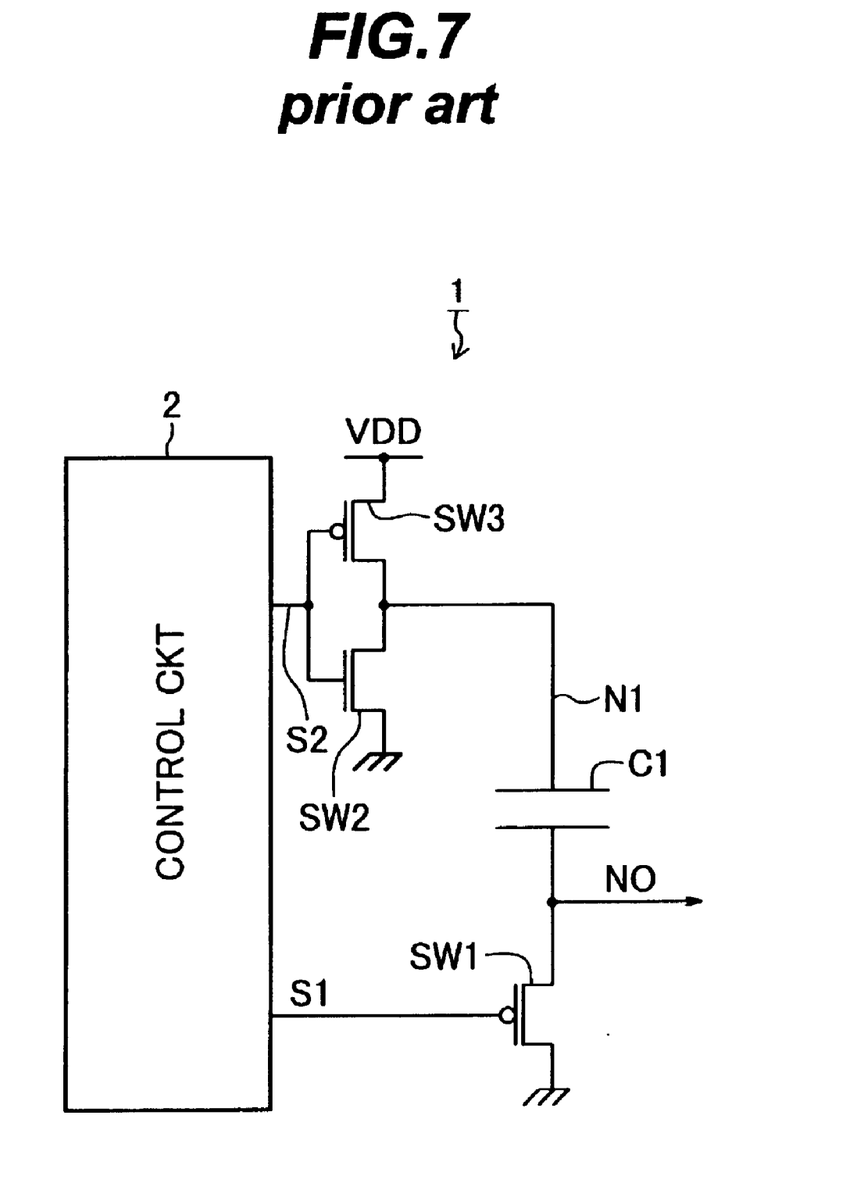
FIG. 7 is a diagram of a prior art negative voltage generating circuit.
Figure 8:
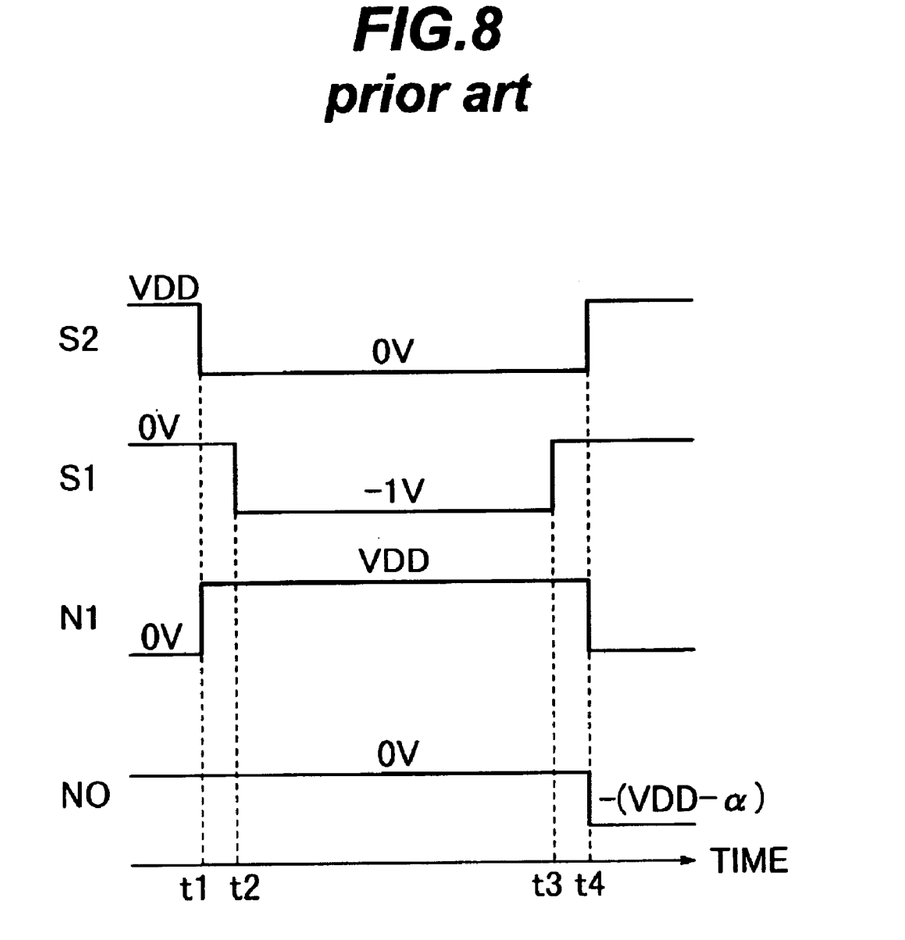
FIG. 8 are diagrams of voltage waveforms in the operation of the circuit of FIG. 7.

FIG. 7 is a view showing a prior art negative voltage generating circuit 1 (Document I: TECHNICAL REPORT OF IEICE, ICD2001-68 (2001-08); Document II: 2001 Symposium on VLSI circuit, C12-3). FIG. 8 are voltage waveform diagrams showing the operation of the circuit of FIG. 7.

A control circuit 2 generates control signals S1 and S2 as shown in FIG. 8 to allow the output node N0 to have negative voltage. This operation is described as follows.

Initially, the control signal S1, the voltage of the output node N0 are at 0V, and the control signal S2 is at a power supply voltage VDD, and thereby PMOS transistor switches SW1 and SW3 are off and a NMOS transistor switch SW2 is on.

(t1) The control signal S2 falls to 0V, so as to turn the NMOS transistor switch SW2 off, and turn the PMOS transistor switch SW3 on, thereby raising the voltage of a node N1 to the power supply voltage VDD.

(t2) The control signal S1 falls to −1V to turn the PMOS transistor switch SW1 on.

(t3) The control signal S1 rises to 0V, so as to turn the PMOS transistor switch SW1 off, and bring the output node N0 into a floating state.

(t4) The control signal S2 rises to the power supply voltage VDD, so as to turn the PMOS transistor switch SW3 off, and turn the NMOS transistor switch SW2 on, thereby lowering the voltage of the node N1 to 0V. Ideally, by the lowering of the voltage of the node N1, the voltage of the output node N0 is lowered to −VDD. However, mainly due to the wire capacitance of the output node N0, it actually becomes −(VDD−α), where α>0.

In another negative voltage generating circuit using a charge pump, the output reaches a predetermined negative value by performing repeated operations, therefore the operation takes a long time and the power consumption becomes higher. In still another negative voltage generating circuit using a switched capacitor, its implementation is difficult since a forward direction current flows through PN junction in off state even when forming a switching transistor using twin well technology. In order to resolve this problem, the circuit must be complicated.

SUMMARY OF THE INVENTION

Accordingly, it is an object of the present invention to provide a negative voltage generating circuit that can generate a deeper negative voltage with simple constitution.

In one aspect of the present invention, there is provided a negative voltage generating circuit comprising: a first capacitor having first and second electrodes facing each other, the first electrode being connected to an output node; a first switching element connected between the output node and a first power supply voltage; a first switching circuit having an output connected through a first node to the second electrode, the first switching circuit selectively coupling the output to one of the first power supply voltage and a second power supply voltage higher than the first power supply voltage, or putting the output into a high impedance state; a second capacitor having first and second electrodes facing each other, the first electrode being connected to the first node; a second switching circuit having an output connected through a second node to the second electrode of the second capacitor, the second switching circuit selectively coupling the output thereof to one of the first power supply voltage and a third power supply voltage higher than the first power supply voltage, or putting the output thereof into a high impedance state.

A control circuit controls the first switching element, the first switching circuit, and the second switching circuit so that:

(1) in a first step, the first switching element is turned on, and the outputs of the first and second switching circuits are coupled to the second power supply voltage and the first power supply voltage, respectively;

(2) in a second step, the output of the second switching circuit is coupled to the third power supply voltage with the output of the first switching circuit being put in the high impedance state; and (3) in a third step, the output of the first switching circuit is coupled to the first power supply voltage with the first switching element being off and the output of the second switching circuit being put in the high impedance state.

Figure 3A:
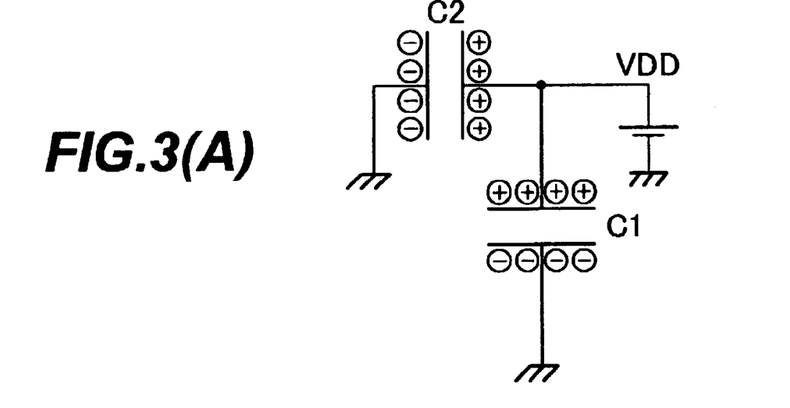
FIGS. 3(A) to 3(C) are three state illustrations with respect to capacitances C1 and C2 in FIG. 1, in the operation of FIG. 2.
Figure 3B:
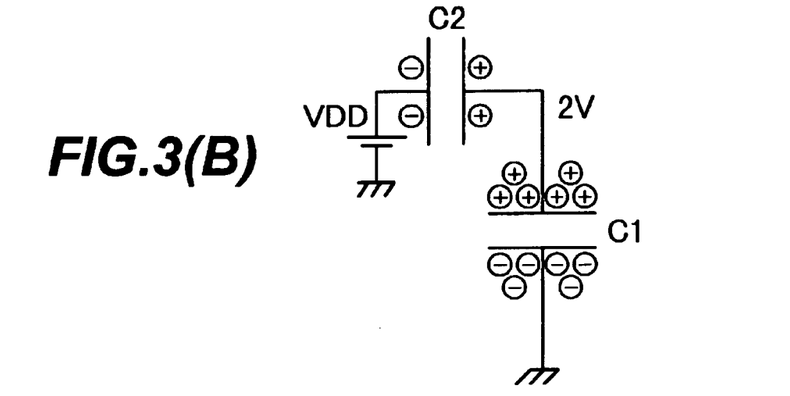
Figure 3C:
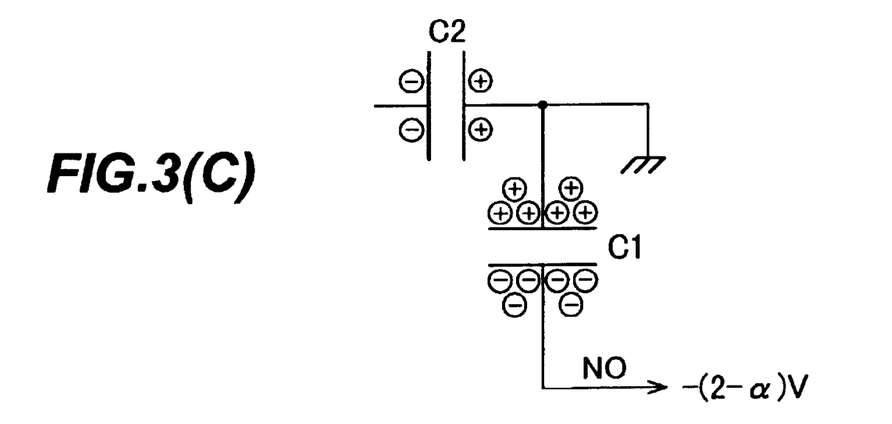

According to this configuration, the first and second capacitors (C1 and C2) are brought into states as shown in FIGS. 3(A) to 3(C) by operations of the first to third steps, respectively, and therefore it is possible to generate a negative voltage deeper than −VDD, when the power supply voltage is VDD, with a simple structure.

Other aspects, objects, and the advantages of the present invention will become apparent from the following detailed description taken in connection with the accompanying drawings.

DESCRIPTION OF THE PREFERRED EMBODIMENT

Hereinafter, a preferred embodiment of the present invention will be described in detail referring to the drawings.

Figure 1:
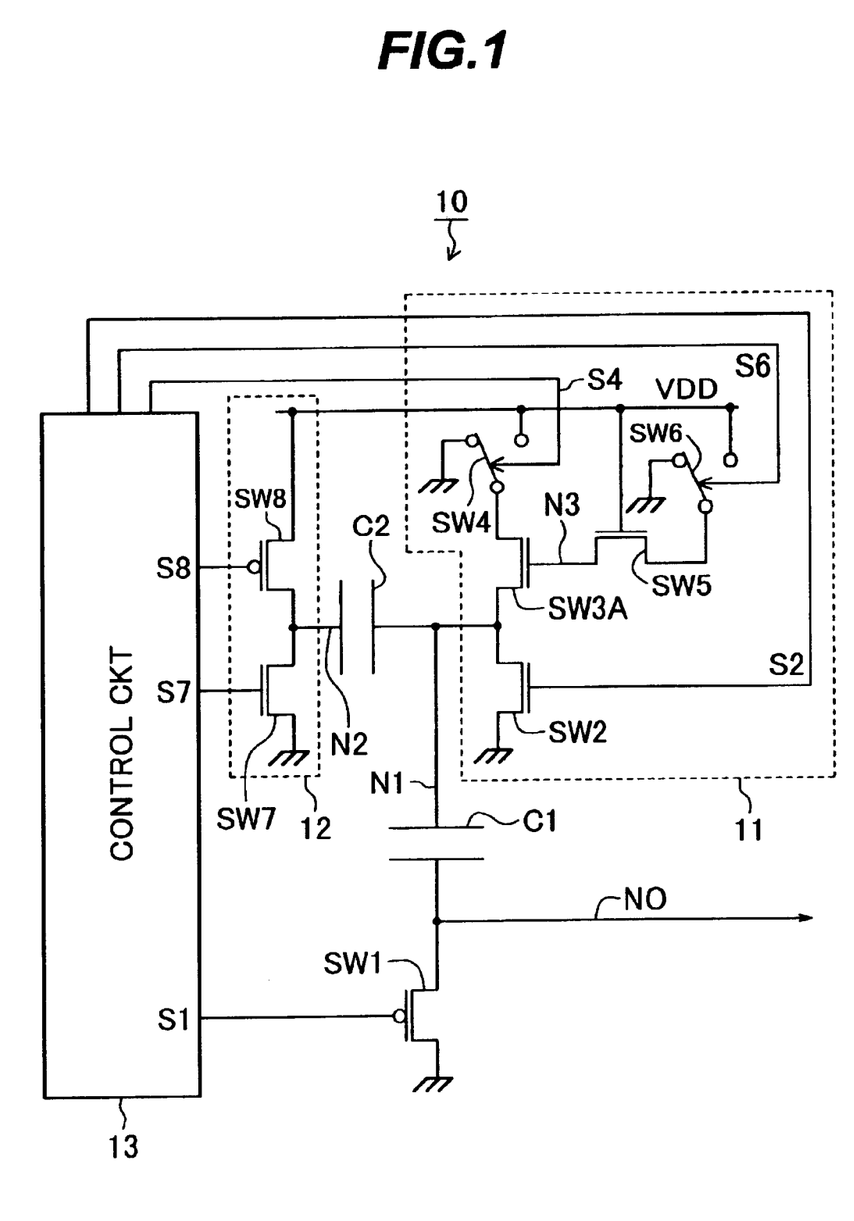
FIG. 1 is a diagram of a negative voltage generating circuit according to a first embodiment of the present invention.

FIG. 1 is a diagram of a negative voltage generating circuit 10 according to a first embodiment of the present invention.

One and the other electrodes of a capacitor C1 are connected to an output node N0 and a node N1, respectively. The output node N0 is connected through a PMOS transistor switch SW1 to ground. The node N1 is connected to one electrode of a capacitor C2 and an output of a switching circuit 11.

The switching circuit 11 is to selectively bring the node N1 into 0V, the power supply voltage VDD, or a floating state. The switching circuit 11 includes an NMOS transistor switch SW2 connected between the node N1 and ground; an NMOS transistor switch SW3A with a source connected to the node N1; a changeover switch SW4 which is, for example, a CMOS inverter, for selectively bringing the drain of the switch SW3A into the power supply voltage VDD or ground; an NMOS transistor switch SW5 with one end connected through a node N3 to the gate of the NMOS transistor switch SW3A; and a changeover switch SW6 which is, for example, a CMOS inverter, for selectively bringing the other end of the switch SW5 into the power supply voltage VDD or ground.

The other electrode of the capacitor C2 is connected through the node N2 to the output of a switching circuit 12. The switching circuit 12 is to selectively bring the node N2 into 0V, the power supply voltage VDD, or a floating state, and includes an NMOS transistor switch SW7 connected between the node N2 and ground; and a PMOS transistor switch SW8 connected between the node N2 and the power supply voltage VDD.

The PMOS transistor switch SW1, the NMOS transistor switches SW2 and SW7, and the PMOS transistor switch SW8 are on/off-controlled by control signals S1, S2, S7, and S8, respectively, from a control circuit 13. The changeover switches SW4 and SW6 are controlled by control signals S4 and S6, respectively, from the control circuit 13.

Figure 2:
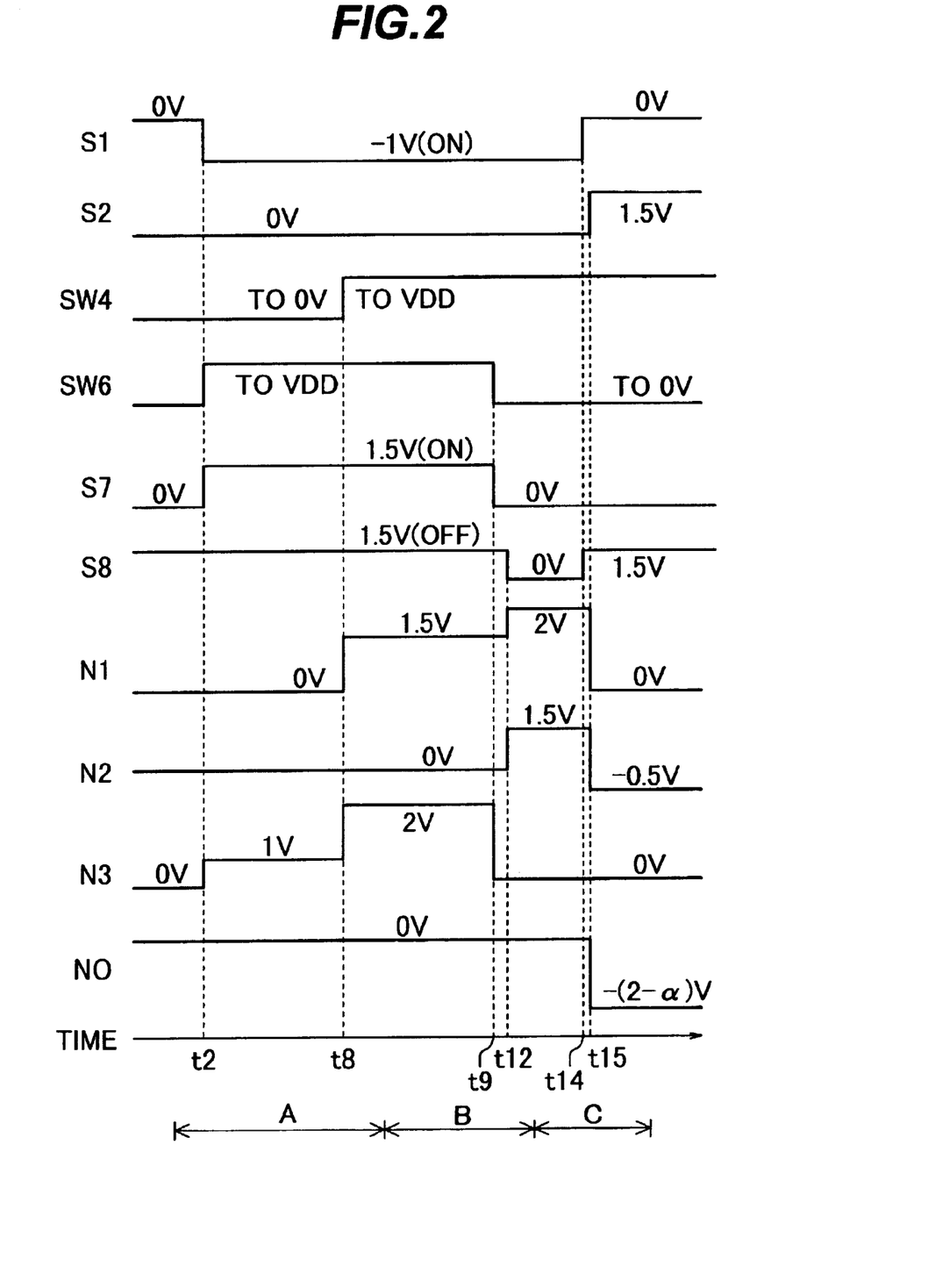
FIG. 2 are diagrams of voltage waveforms and switch states in the operation of the circuit of FIG. 1.

FIG. 2 shows voltage waveforms and switch states in the operation of the circuit of FIG. 1. In this figure, there is shown a case where the power supply voltage VDD is 1.5V. "i" of time ti shown in this figure is numbered intermittently in order to make time points correspond to those of FIG. 5 explained below. The operation of the circuit of FIG. 1 is divided into three steps A to C, each corresponding to FIGS. 3(A) to 3(C).

Initially, the nodes N1 to N3, and the control signals S1, S2, and S7 are at 0V; the control signal S8 is at the power supply voltage VDD; and the changeover switches SW4 and SW6 are flipped to 0V, thereby the PMOS transistor switches SW1 and SW8, and NMOS transistor switches SW2, SW3A, SW5, and SW7 are off.

Step A (t2) The control signal S1 falls to −1V and the control signal S7 rises to the power supply voltage VDD, turning the PMOS transistor switch SW1 and the NMOS transistor switch SW7 on. Further, the changeover switch SW6 is flipped to the power supply voltage VDD, turning the NMOS transistor switch SW5 on, and the voltage of the node N3 rises until the potential difference between the gate of the NMOS transistor switch SW5 and the node N3 becomes equal to the threshold voltage Vthn of the NMOS transistor switch SW5. In this case, the node N3 rises to 1.0V, turning the NMOS transistor switch SW5 off, and therefore the node N3 becomes a floating state.

(t8) The changeover switch SW4 is flipped to the power supply voltage VDD. Due to a parasitic capacitance between the drain and the gate of the NMOS transistor switch SW3A, with following the increase in the drain voltage of the NMOS transistor switch SW3A, the voltage of the node N3 in the floating state rises to about 2V. This causes the NMOS transistor switch SW3A to be turned on, raising the node N1 to the power supply voltage VDD. Here, the NMOS transistor switch SW5 is off.

This operation brings the capacitors C1 and C2 into the state as shown in FIG. 3(A).

Step B (t9) The changeover switch SW6 is flipped to 0V, so that the NMOS transistor switch SW5 is turned on, and the node N3 goes to 0V. Thereby, the NMOS transistor switch SW3A is turned off and the node N1 is brought into a floating state. Further, the control signal S7 falls to 0V, turning the NMOS transistor switch SW7 off, and therefore the node N2 is brought into a floating state.

(t12) The control signal S8 falls to 0V, so that the PMOS transistor switch SW8 is turned on, and the voltage of the node N2 rises to the power supply voltage VDD. This allows the voltage of the node N1 to rise to a voltage, 2.0V for example, determined by the capacitance ratio between the capacitors C1 and C2.

This operation brings the capacitors C1 and C2 into the state as shown in FIG. 3(B).

Step C (t14) The control signals S8 and S1 rise to the power supply voltage VDD and 0V, respectively, so that both the PMOS transistor switches SW8 and SW1 are turned off, and the nodes N2 and N0 are brought into a floating state.

(t15) The control signal S2 rises to the power supply voltage VDD, so that the NMOS transistor switch SW2 is turned on, and the voltage of the node N1 decreases to 0V. Following this decrease, the nodes N2 and N0 in floating state become −0.5V (on the assumption that the parasitic capacitance of the node N2 is negligible) and $-(2-\alpha)$V, respectively, where a is the same as explained regarding FIG. 8, and depends on the capacitance of C1 and parasitic capacitances between ground and the output node N0 and also between the electrodes of the PMOS transistor switch SW1. When the parasitic capacitances are negligible, α is equal to 0V. For example, α is equal to 0.1V. In addition, because the control signal S1 is 0V, the PMOS transistor switch SW1 keeps off even when the output node N0 drops to $-(2-\alpha)$V.

This operation brings the capacitors C1 and C2 into the state as shown in FIG. 3(C).

Thus, the negative voltage generating circuit 10 of FIG. 1 can generate negative voltage deeper than −VDD with the simple structure.

Figure 4:
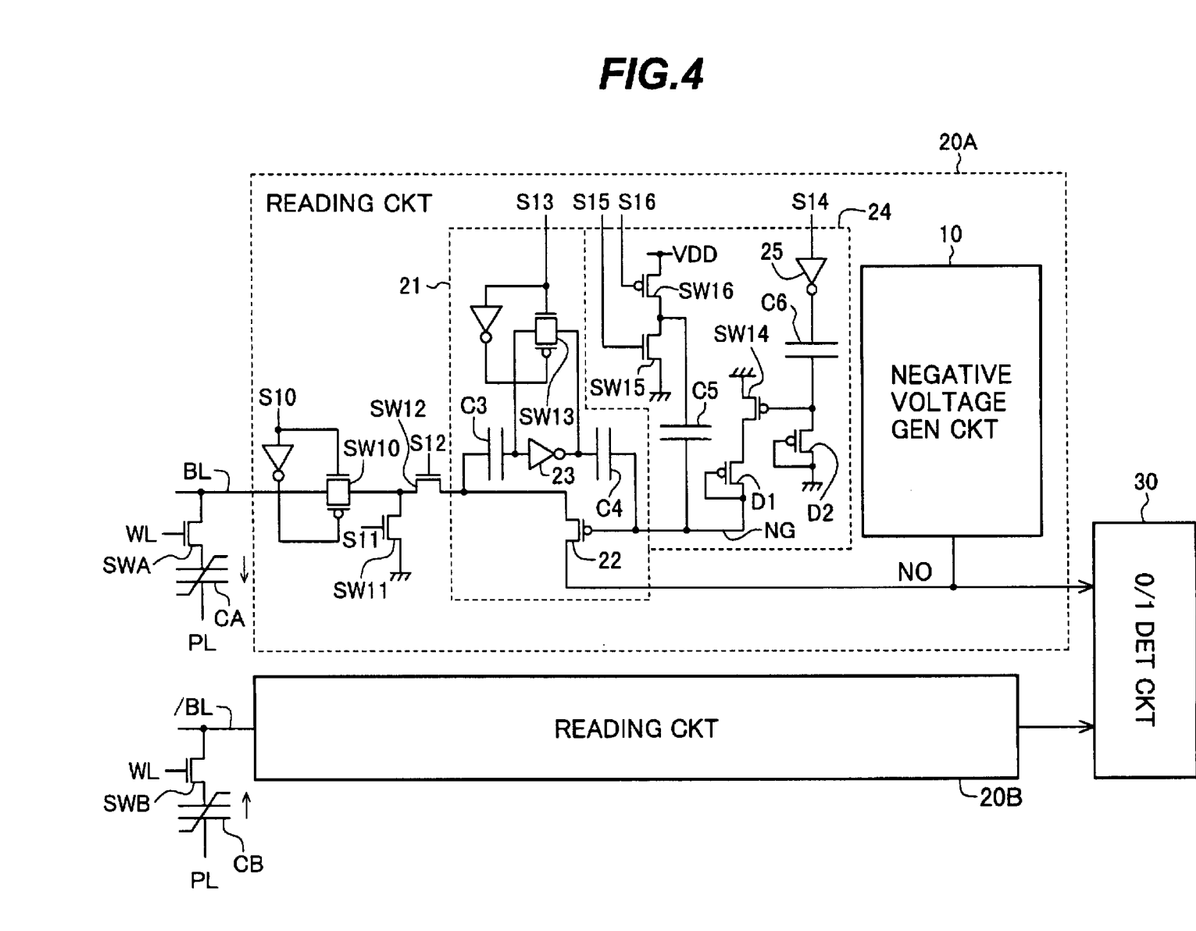
FIG. 4 is a diagram of a ferroelectric memory circuit that adopts the circuit of FIG. 1.
Figure 5:
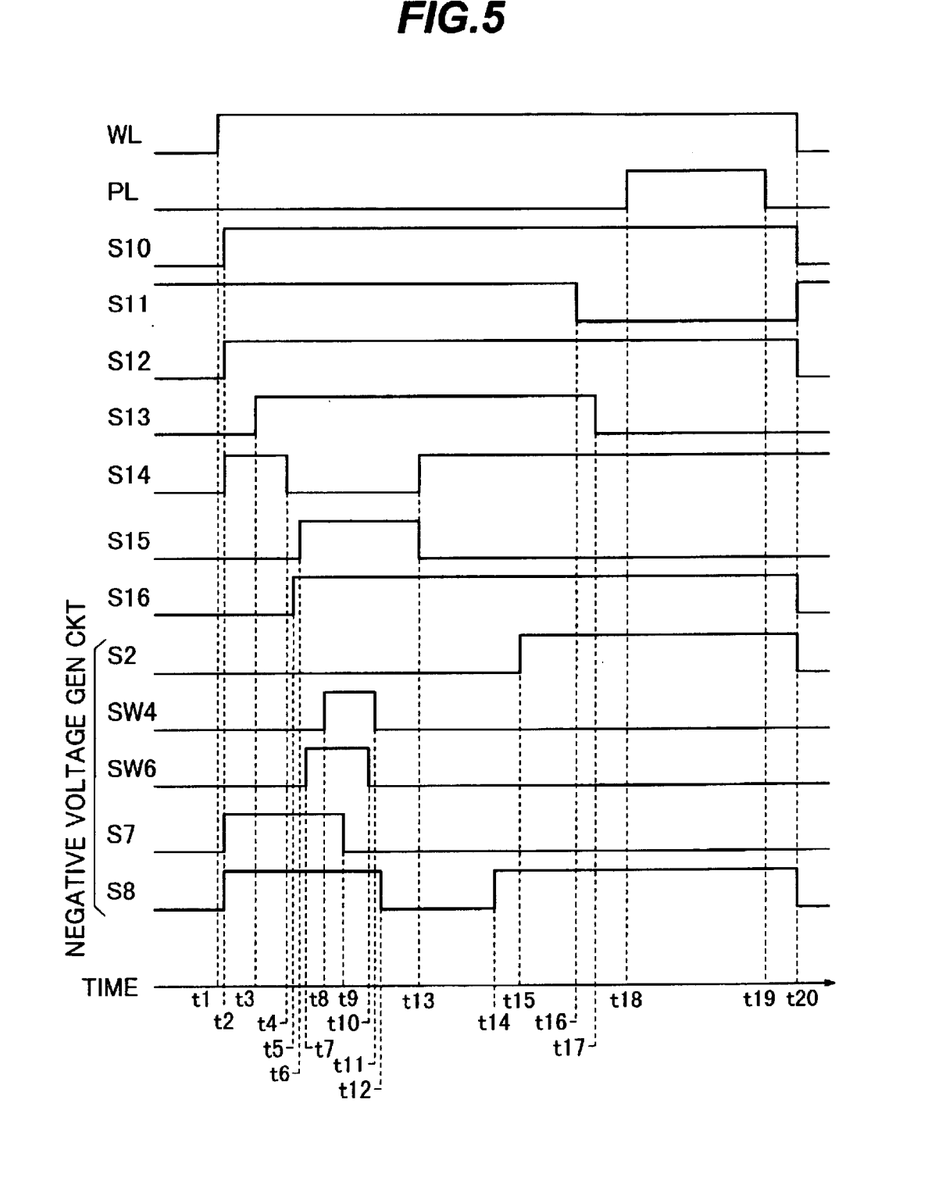
FIG. 5 is a timing diagram illustrating the operation of the circuit of FIG. 4.

FIG. 4 shows a ferroelectric memory circuit that adopts the circuit of FIG. 1. This memory circuit is formed on a chip of a semiconductor circuit device. FIG. 5 is a timing diagram illustrating the operation of the circuit of FIG. 4. The signal timings in FIG. 5, related to the negative voltage generating circuit 10, are similar to those of the FIG. 2. For example, time t2 in the FIG. 2 corresponds to time t2 in the FIG. 5.

Figure 6:
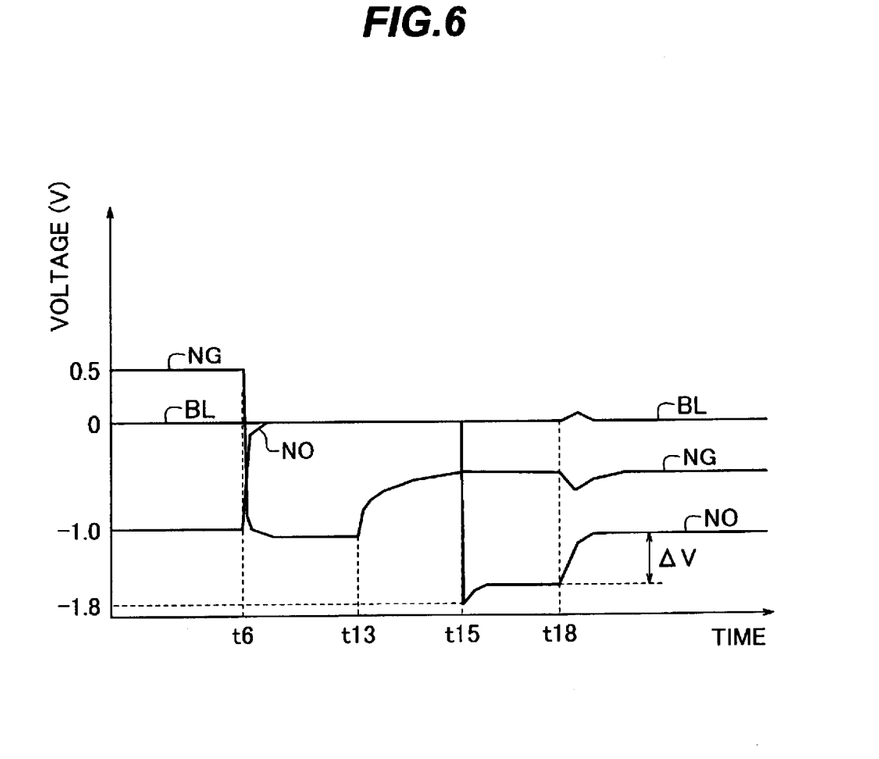
FIG. 6 are diagrams of voltage waveforms at the nodes N0 and NG and the bit line BL of FIG. 4, in the operation of FIG. 5.

FIG. 6 shows voltage waveforms of the nodes N0 and NG and the bit line BL of FIG. 4, in the operation of FIG. 5.

A pair of ferroelectric capacitors CA and CB are connected through NMOS transistor switches SWA and SWB to bit lines BL and /BL, respectively. In order to enlarge the potential difference read from the memory cell, storing is made in the complementary ferroelectric capacitors CA and CB in such a manner that residual polarizations are in reverse direction to each other as shown with arrows in FIG. 4. The gates of the NMOS transistor switches SWA and SWB are commonly connected to the word line WL.

With the bit lines BL and/BL precharged to 0V, the word line WL is set high to turn the NMOS transistor switches SWA and SWB on (t1), and when the voltage in the plate line PL rises from 0V to the power supply voltage VDD (t18), electric charges at the ferroelectric capacitors CA and CB move to the bit lines BL and/BL, respectively. The amount of moved electric charges differs depending on the direction of the residual polarization of the ferroelectric capacitor CA. In the case of FIG. 4, the polarization of the ferroelectric capacitor CA is reversed by the rising in the voltage of the plate line PL, but that of the ferroelectric capacitor CB is not reversed. For this reason, the amount of electric charge moved to the bit line BL is larger than that of the bit line/BL.

It is possible to determine the stored contents by amplifying the potential difference between the bit lines BL and/BL. However, the movement of electric charges into the bit lines BL and/BL raises their voltages, lowering the voltages across the electrodes of both the ferroelectric capacitors CA and CB. Therefore when the power supply voltage VDD is lowered to, for example, 1.5V for reduction in the power consumption, influences from the lowering of the inter-electrode voltages become large, and the amount of electric charges moved to the bit lines BL and/BL becomes small, reducing the potential difference between the bit lines BL and/BL. This reduction, combined with a reduction in the movement of electric charges due to imprint effect, increases the possibility of error occurrence in reading.

For this reason, the bit line BL is connected through a reading circuit 20A to a read-value determining circuit 30. The reading circuit 20A allows the node N0 to take negative voltage (t15 to t18 in FIG. 6) so as to transfer electric charges on the bit lines BL into the node N0, and also keeps the voltage of the bit line BL at 0V to raise the voltage of the node N0 by $\Delta V$ proportional to the movement amount of electric charges.

Similarly, the bit line/BL is connected, through a reading circuit 20B with the same structure as the reading circuit 20A, to the read-value determining circuit 30. The read-value determining circuit 30 amplifies the output potential difference between the reading circuits 20A and 20B by a sense amplifier and determines it as '0' or '1'.

Now, description will now be given about the configuration of the reading circuit 20A.

The bit line BL is connected to one end of a column switch SW10 that is selectively on according to the column address. The column switch SW10 is formed by an NMOS transistor and a PMOS transistor connected in parallel to each other. The gates of these NMOS and PMOS transistors respectively receive a control signal S10 and its inverted signal by an inverter. The column switch SW10 is turned on when the control signal S10 is at the power supply voltage VDD, and off when it is at 0V. The other end of the column switch SW10 is, on one hand, connected through an NMOS transistor switch SW11 to ground, and is, on the other hand, connected to a node (bus) N0 through a bus connection NMOS transistor switch SW12 and the electric charge transfer circuit 21. The NMOS transistor switch SW11 is to precharge a node of the transistor S12, which is on the side of the transistor 22, to 0V during a period when the NMOS transistor switch SW12 is on, and also precharge the bit line BL to 0V during a period (t2 to t16) from turning-on of the column switch SW10 until rising in the voltage of the plate line PL.

The node N0 is connected to the output of the negative voltage generating circuit 10 of FIG. 1, and electric charges from the bit line BL move through the node N0 to the capacitor C1 of FIG. 1. The smaller the capacitance value of the capacitor C1 is, the larger the voltage increase of the node N0 relative to the amount of moved electric charges is, and therefore the output potential difference between the reading circuits 20A and 20B becomes larger, allowing further reduction in the possibility of error occurrence in reading. When the power supply voltage VDD is lowered for a low power consumption, it is required to lower much more the negative voltage generated by the negative voltage generating circuit 10, in order to enlarge the voltage increase in the node N0 with keeping the node N0 at a negative voltage. The above-mentioned negative voltage generating circuit of FIG. 1 can satisfy this requirement.

The electric charge transfer circuit 21 includes the PMOS transistor 22, for transferring electric charges, connected between the NMOS transistor switch SW12 and the node N0; a capacitor C3, an inverter amplifier 23, and a capacitor C4 that are connected in series between the source and gate of the transistor 22; and a reset switch SW13 connected in parallel to the inverter amplifier 23. The capacitors C3 and C4 are to cut the DC component. To cause the operation points in the input and output of the inverter amplifier 23 to have same voltage, VDD/2, in order to maximize the sensitivity of the amplifier 23 and linearize the input and output characteristic of the amplifier 23, the reset switch SW13 is turned on by coupling the control signal S13 to the power supply voltage VDD before transferring of electric current from the bit line BL to the node N0 and then it is turned off (t3 to t17) before the voltage of the plate line PL rises (t18).

When the voltage of the plate line PL rises at time t18 so that electric charges on the ferroelectric capacitor CA goes to the bit line BL, the voltage of the bit line BL starts to increase from 0V. Thereby the gate voltage of the PMOS transistor 22 is decreased by the inverter amplifier 23, in result of increasing the movement amount of electric charges from the bit line BL to the node N0. When the voltage of the bit line BL starts to decrease from 0V by excessively running away of electric charges from the bit line BL, the gate voltage of the PMOS transistor 22 is increased by the inverter amplifier 23 and therefore the movement of electric charges from the bit line BL to the node N0 is decreased or stopped, in result of increasing the voltage of the bit line BL. This allows the voltage of the bit line BL to keep 0V, and due to the movement of electric charges from the bit line BL to the node N0, the voltage of the node N0 increases by $\Delta V$.

The gate of the PMOS transistor 22 is connected through the node NG to the output of a gate bias generating circuit 24 that generates first and second bias voltages sequentially. The first bias voltage is to reset the node N0 to 0V by turning the PMOS transistor 22 on (t6 to t13) when the node N0 is at a negative voltage before being reset, for example –1.0V, with the switches SW10 to SW12 on. The second bias voltage is to apply a threshold voltage Vthp=–0.5V between the gate and source of the PMOS transistor 22 when electric charges on the bit line BL are transferred to the node N0 (t18 to t19).

In the gate bias generating circuit 24, the node NG is connected through the diode D1 and the PMOS transistor switch SW14 to ground. The diode D1 of FIG. 4 is formed by a diode-connected PMOS transistor. When the PMOS transistor switch SW14 is on, the voltage of the node NG becomes −0.5V that is lower than ground by the forward voltage of the diode D1, 0.5V(=−Vthp). In order to generate the first bias voltage of −1.0V, the node NG is connected to one electrode of the capacitor C5. The other electrode of the capacitor C5 is, on one hand, connected through the NMOS transistor switch SW15 to ground, and, on the other hand, connected through the PMOS transistor switch SW16 to the power supply voltage VDD. The switches SW15 and SW16 receive the control signals S15 and S16, respectively.

With the PMOS transistor switch SW16 on (t1 to t5), the PMOS transistor switch SW14 is turned on (t2 to t4), applying 0.5V (=−Vthp) to the node NG, and then the PMOS transistor switch SW14 is turned off (t4 to t13), bringing the node NG into the floating state. In this state, the PMOS transistor switch SW16 is turned off (t5 to t20), and the NMOS transistor switch SW15 is turned on (t6 to t13), changing the voltage of the node NG from 0.5V to −1.0V.

In order to generate the second bias voltage, the gate of the PMOS transistor switch SW14 is, on one hand, connected through the diode D2 to ground, and, on the other hand, connected through the capacitor C6 to the output of the inverter 25. The input of the inverter 25 receives the control signal S14. When the control signal S14 is 0V (t4 to t13), charging is made to the capacitor C6. At this time, the gate voltage of the PMOS transistor switch SW14 becomes equal to the forward voltage, 0.5V. From this state, when the control signal S14 rises to the power supply voltage VDD (t13), the gate voltage of the PMOS transistor switch SW14 decreases to −1V with the gate thereof being in a floating state, and thereby the PMOS transistor switch SW14 is turned on and the voltage of the node NG increases from −1V. When the voltage of the node NG increases by 0.5V to the second bias voltage of −0.5V, because the PMOS transistor D1 is turned off, the voltage of the node NG becomes no higher than −0.5V.

Such gate bias generating circuit 24 is simpler in structure than those disclosed in the prior art documents I and II, and is also smaller in the number of capacitors, which allows reduction in the power consumption.

Although a preferred embodiment of the present invention has been described, it is to be understood that the invention is not limited thereto and that various changes and modifications may be made without departing from the spirit and scope of the invention.

For example, the on-chip area may be reduced using ferroelectric capacitors as the capacitors C1 to C6 not generating inversed polarizations.

In addition, in FIG. 4, instead of including the reading circuit 20B and the memory cell connected thereto, it may be constituted such that a reference voltage is provided to the determining circuit 30.

What is claimed is:

1. A negative voltage generating circuit comprising:
   a first capacitor having first and second electrodes facing each other, the first electrode being connected to an output node;
   a first switching element connected between the output node and a first power supply voltage;
   a first switching circuit having an output connected through a first node to the second electrode, the first switching circuit selectively coupling the output to one of the first power supply voltage and a second power supply voltage higher than the first power supply voltage, or putting the output into a high impedance state;
   a second capacitor having first and second electrodes facing each other, the first electrode being connected to the first node;
   a second switching circuit having an output connected through a second node to the second electrode of the second capacitor, the second switching circuit selectively coupling the output thereof to one of the first power supply voltage and a third power supply voltage higher than the first power supply voltage, or putting the output thereof into a high impedance state; and
   a control circuit controlling the first switching element, the first switching circuit, and the second switching circuit so that:
   (1) in a first step, the first switching element is turned on, and the outputs of the first and second switching circuits are coupled to the second power supply voltage and the first power supply voltage, respectively;
   (2) in a second step, the output of the second switching circuit is coupled to the third power supply voltage with the output of the first switching circuit being put in the high impedance state; and
   (3) in a third step, the output of the first switching circuit is coupled to the first power supply voltage with the first switching element being off and the output of the second switching circuit being put in the high impedance state.

2. The negative voltage generating circuit according to claim 1, wherein the first switching circuit comprises:
   a second switching element connected between the first node and the first power supply voltage;
   a third switching element having a current path, a first end of the current path being connected to the first node; and
   a fourth switching element for selectively coupling a second end of the current path of the third switching element to one of the first and second power supply voltages.

3. The negative voltage generating circuit according to claim 2, wherein both the second and third switching elements in the first switching circuit are NMOS transistors, the first switching circuit further comprising:
   an NMOS transistor as a fifth switching element having a current path whose first end is connected to a gate of the third switching element, a gate of the fifth switching element being connected to the second power supply voltage; and
   a sixth switching element for selectively coupling a second end of the current path of the fifth switching element to one of the first and third power supply voltages.

4. The negative voltage generating circuit according to claim 1, wherein the second switching circuit comprises:
   a seventh switching element connected between the second node and the first power supply voltage; and
   an eighth switching element connected between the second node and the second power supply voltage.

5. The negative voltage generating circuit according to 4, wherein in the second switching circuit, the seventh and eighth switching elements are an NMOS transistor and a PMOS transistor, respectively.

6. The negative voltage generating circuit according to claim 1, wherein the first switching element is a PMOS transistor.

7. The negative voltage generating circuit according to claim 1, wherein the third power supply voltage is equal to the second power supply voltage.

8. A ferroelectric memory circuit wherein a reading is made by transferring an electric charge depending on a residual polarization of a ferroelectric capacitor to a bit line having been reset to a first power supply voltage, the ferroelectric capacitor constituting a memory cell, the ferroelectric memory circuit comprising:
 a negative voltage generating circuit including:
  a first capacitor having first and second electrodes facing each other, the first electrode being connected to an output node;
  a first switching element connected between the output node and a first power supply voltage;
  a first switching circuit having an output connected through a first node to the second electrode, the first switching circuit selectively coupling the output to one of the first power supply voltage and a second power supply voltage higher than the first power supply voltage, or putting the output into a high impedance state;
  a second capacitor having first and second electrodes facing each other, the first electrode being connected to the first node;
  a second switching circuit having an output connected through a second node to the second electrode of the second capacitor, the second switching circuit selectively coupling the output thereof to one of the first power supply voltage and a third power supply voltage higher than the first power supply voltage, or putting the output thereof into a high impedance state; and
  a control circuit controlling the first switching element, the first switching circuit, and the second switching circuit so that:
   (1) in a first step, the first switching element is turned on, and the outputs of the first and second switching circuits are coupled to the second power supply voltage and the first power supply voltage, respectively;
   (2) in a second step, the output of the second switching circuit is coupled to the third power supply voltage with the output of the first switching circuit being put in the high impedance state; and
   (3) in a third step, the output of the first switching circuit is coupled to the first power supply voltage with the first switching element being off and the output of the second switching circuit being put in the high impedance state;
 an electric charge transfer circuit, connected between the bit line and the output node of the negative voltage generating circuit, for transferring an electric charge on the bit line to the output node so that the bit line keeps the first power supply voltage after the control circuit of the negative voltage generating circuit performs the third step; and
 a read-value determining circuit for determining a value read from the memory cell on the basis of a voltage of the output node after the transferring of the electric charge to the output node.

9. The ferroelectric memory circuit according to claim 8, wherein the first switching circuit comprises:
 a second switching element connected between the first node and the first power supply voltage;
 a third switching element having a current path, a first end of the current path being connected to the first node; and
 a fourth switching element for selectively coupling a second end of the current path of the third switching element to one of the first and second power supply voltages.

10. The ferroelectric memory circuit according to claim 9, wherein both the second and third switching elements in the first switching circuit are NMOS transistors, the first switching circuit further comprising:
 an NMOS transistor as a fifth switching element having a current path whose first end is connected to a gate of the third switching element, a gate of the fifth switching element being connected to the second power supply voltage; and
 a sixth switching element for selectively coupling a second end of the current path of the fifth switching element to one of the first and third power supply voltages.

11. The ferroelectric memory circuit according to claim 8, wherein the second switching circuit comprises:
 a seventh switching element connected between the second node and the first power supply voltage; and
 an eighth switching element connected between the second node and the second power supply voltage.

12. The ferroelectric memory circuit according to 11, wherein in the second switching circuit, the seventh and eighth switching elements are an NMOS transistor and a PMOS transistor, respectively.

13. The ferroelectric memory circuit according to claim 8, wherein the first switching element is a PMOS transistor.

14. The ferroelectric memory circuit according to claim 8, wherein the third power supply voltage is equal to the second power supply voltage.

15. A semiconductor circuit device having a semiconductor chip on which a negative voltage generating circuit is formed, wherein the negative voltage generating circuit comprises:
 a first capacitor having first and second electrodes facing each other, the first electrode being connected to an output node;
 a first switching element connected between the output node and a first power supply voltage;
 a first switching circuit having an output connected through a first node to the second electrode, the first switching circuit selectively coupling the output to one of the first power supply voltage and a second power supply voltage higher than the first power supply voltage, or putting the output into a high impedance state;
 a second capacitor having first and second electrodes facing each other, the first electrode being connected to the first node;
 a second switching circuit having an output connected through a second node to the second electrode of the second capacitor, the second switching circuit selectively coupling the output thereof to one of the first power supply voltage and a third power supply voltage higher than the first power supply voltage, or putting the output thereof into a high impedance state; and
 a control circuit controlling the first switching element, the first switching circuit, and the second switching circuit so that:
  (1) in a first step, the first switching element is turned on, and the outputs of the first and second switching circuits are coupled to the second power supply voltage and the first power supply voltage, respectively;

(2) in a second step, the output of the second switching circuit is coupled to the third power supply voltage with the output of the first switching circuit being put in the high impedance state; and (3) in a third step, the output of the first switching circuit is coupled to the first power supply voltage with the first switching element being off and the output of the second switching circuit being put in the high impedance state.

16. A semiconductor circuit device having a semiconductor chip on which a ferroelectric memory circuit is formed, wherein in the ferroelectric memory circuit, a reading is made by transferring an electric charge depending on a residual polarization of a ferroelectric capacitor to a bit line having been reset to a first power supply voltage, the ferroelectric capacitor constituting a memory cell, wherein the ferroelectric memory circuit comprises:

a negative voltage generating circuit including:

a first capacitor having first and second electrodes facing each other, the first electrode being connected to an output node;

a first switching element connected between the output node and a first power supply voltage;

a first switching circuit having an output connected through a first node to the second electrode, the first switching circuit selectively coupling the output to one of the first power supply voltage and a second power supply voltage higher than the first power supply voltage, or putting the output into a high impedance state;

a second capacitor having first and second electrodes facing each other, the first electrode being connected to the first node;

a second switching circuit having an output connected through a second node to the second electrode of the second capacitor, the second switching circuit selectively coupling the output thereof to one of the first power supply voltage and a third power supply voltage higher than the first power supply voltage, or putting the output thereof into a high impedance state; and a control circuit controlling the first switching element, the first switching circuit, and the second switching circuit so that:

(1) in a first step, the first switching element is turned on, and the outputs of the first and second switching circuits are coupled to the second power supply voltage and the first power supply voltage, respectively;

(2) in a second step, the output of the second switching circuit is coupled to the third power supply voltage with the output of the first switching circuit being put in the high impedance state; and (3) in a third step, the output of the first switching circuit is coupled to the first power supply voltage with the first switching element being off and the output of the second switching circuit being put in the high impedance state;

an electric charge transfer circuit, connected between the bit line and the output node of the negative voltage generating circuit, for transferring an electric charge on the bit line to the output node so that the bit line keeps the first power supply voltage after the control circuit of the negative voltage generating circuit performs the third step; and a read-value determining circuit for determining a value read from the memory cell on the basis of a voltage of the output node after the transferring of the electric charge to the output node.

* * * * *